(12) United States Patent
Hatano (10) Patent No.: US 7,167,073 B2
(45) Date of Patent: Jan. 23, 2007

(54) SEMICONDUCTOR DEVICE

(75) Inventor: Hiroyuki Hatano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 205 days.

(21) Appl. No.: 10/969,578

(22) Filed: Oct. 20, 2004

(65) Prior Publication Data

US 2005/0088269 A1    Apr. 28, 2005

(30) Foreign Application Priority Data

Oct. 24, 2003    (JP)    ............................. 2003-363943

(51) Int. Cl.
*H01F 5/00*    (2006.01)
(52) U.S. Cl. ...................................... 336/200
(58) Field of Classification Search ................. 336/65, 336/83, 200, 220–222, 232; 257/531
See application file for complete search history.

(56) References Cited

U.S. PATENT DOCUMENTS

| | | | | |
|---|---|---|---|---|
| 3,858,138 | A * | 12/1974 | Gittleman et al. | ........... 336/136 |
| 5,336,921 | A * | 8/1994 | Sundaram et al. | ........... 257/531 |
| 6,013,939 | A * | 1/2000 | El-Sharawy et al. | ........ 257/531 |
| 6,292,084 | B1 * | 9/2001 | Choi et al. | .................. 336/200 |
| 6,367,143 | B1 * | 4/2002 | Sugimura | .................. 29/602.1 |
| 7,107,666 | B1 * | 9/2006 | Hiatt et al. | ................. 29/602.1 |

FOREIGN PATENT DOCUMENTS

| | | |
|---|---|---|
| JP | 58-188115 A | 11/1983 |
| JP | 63-67264 U | 5/1988 |
| JP | 02-181961 A | 7/1990 |
| JP | 04-76057 U | 7/1992 |
| JP | 04-335531 A | 11/1992 |
| JP | 06-021347 | 1/1994 |
| JP | 07-273292 | 10/1995 |
| JP | 10-335165 A | 12/1998 |

OTHER PUBLICATIONS

Official Communication issued in the corresponding Japanese Patent Application No. JP 2003-363943, mailed on Nov. 15, 2005.

* cited by examiner

*Primary Examiner*—Tuyen T Nguyen
(74) *Attorney, Agent, or Firm*—Keating & Bennett, LLP (57) ABSTRACT

A semiconductor device increases the efficiency of the inductor having a three-dimensional spiral coil and increases the inductance value without requiring any special steps. The semiconductor device includes semiconductor elements and first, second and third metal wire layers to be used for the configuration of the semiconductor elements, a core disposed on the second metal wire layer, and a coil wherein a plurality of pieces of the first metal wire layer and a plurality of pieces of the third metal wire layer connected to the pieces via the connection holes are connected in series to define a spiral surrounding the core.

12 Claims, 6 Drawing Sheets

SEMICONDUCTOR DEVICE

BACKGROUND OF THE INVENTION

1. Field of the Invention

The present invention relates to a semiconductor device including a coil.

2. Description of the Related Art

Figure 6:
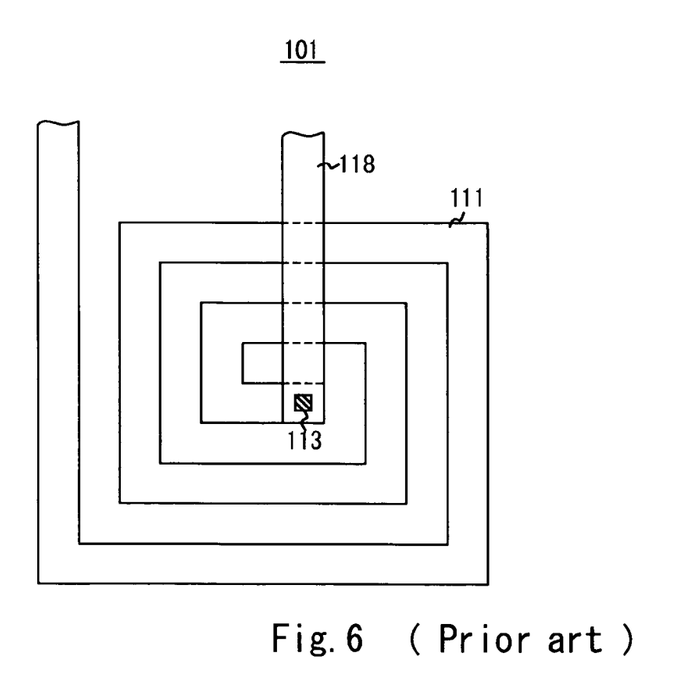
FIG. 6 is a plan view depicting an inductor of the prior art.

There has been a semiconductor device including a coil defined by a metal wire layer formed in a spiral, so as to obtain the desired inductance. FIG. 6 shows an example of an inductor (coil) included in such a semiconductor device. In this inductor 101, the occupying area increases two-dimensionally if the number of turns of one layer of the metal wire layer 111 increases, so the occupying area and the length of the metal wire required for a unit number of turns increases according to the number of turns. Therefore, in order to achieve a large inductance value L, it is a matter of course that the occupying area of the inductor 101 increases, and the resistance value R of the metal wire constituting the inductor 101 per unit number of turns also increases, and the value Q, which indicates the sharpness of resonance, given by $Q=\omega_0 \times L/R$ drops ($\omega_0$ is the resonance angular frequency). In FIG. 6, 118 is a terminal formed on another metal wire layer, and 113 is a connection hole for electrically connecting one metal wire layer 111 and the terminal 118.

Figure 7:
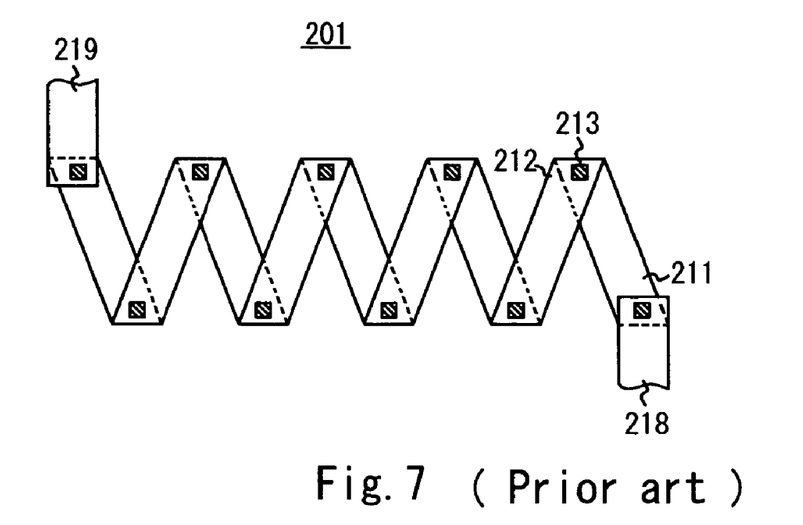
FIG. 7 is a plan view depicting another inductor of the prior art.

In an attempt to solve the above-described problems, a semiconductor device including an inductor, which does not increase the occupying area and the length of the metal wire per unit number of turns even if the number of turns is increased, by forming the coil three-dimensionally, has been proposed (e.g. Japanese Patent Application Laid-Open No. H6-21347, and Japanese Patent Application Laid-Open No. H7-273292). FIG. 7 shows an example of this three-dimensional inductor. In this inductor 201, a plurality of pieces 211 formed on the bottom metal wire layer and a plurality of pieces 212 formed on the top metal wire layer are disposed in parallel respectively, sandwiching an inter-layer insulation film, which is not illustrated, connecting these plurality of pieces 211 and 212, so as to define a serial connection, via the connection holes 213, so as to form a three-dimensional spiral. In this inductor 201, the number of turns per area is high, and the length of the metal wire to receive a predetermined inductance value can be small, so the above mentioned value Q can be increased. In FIG. 7, 219 is a terminal at one side connected to the piece 211 to be the start edge, and 218 is a terminal at the other side connected to the piece 211 to be the end edge.

Figure 8:
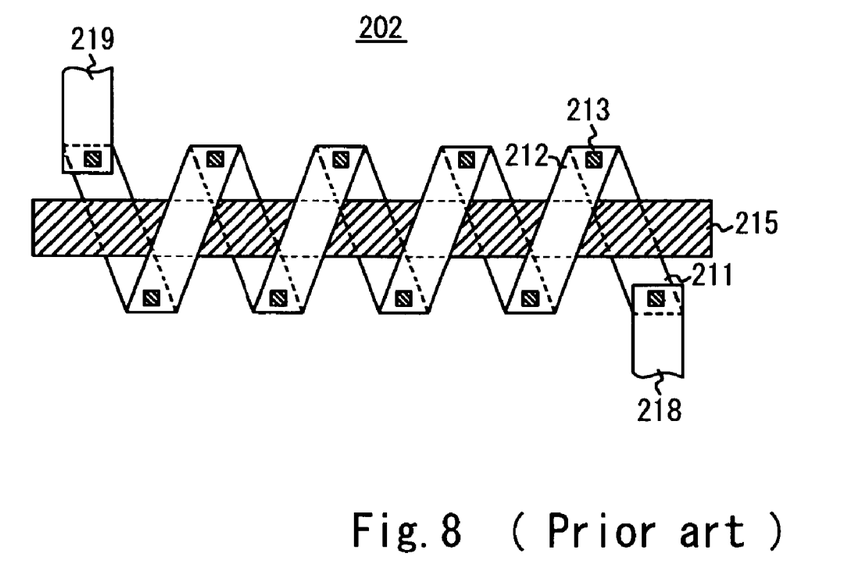
FIG. 8 is a plan view depicting still another inductor of the prior art.

In order to further increase the inductance value, as shown in FIG. 8, an inductor 202, having a structure including a ferro-magnetic core 215 which is formed by an insulation film sandwiching an iron conductor layer or an oxide film containing an iron substance, for example, between the pieces 211 and 212 of the top and bottom metal wire layers, has been proposed (e.g. above-mentioned Japanese Patent Application Laid-Open No. H6-21347, and Japanese Patent Application Laid-Open No. H7-273292). This inductor 202 can increase the magnetic flux density passing through the ferro-magnetic core 215, so the inductance value can be further increased.

The three-dimensional inductor 202 including the ferro-magnetic core 215 shown in FIG. 8, however, requires special steps of forming the ferro-magnetic core 215 between the pieces 211 and the pieces 212 of the top and bottom metal wire layers, which causes increased costs and low yield.

The inductor 201, not having the ferro-magnetic core 215, on the other hand, can increase the inductance value by increasing the occupying area thereof, but if the semiconductor device has a practically appropriate chip size, the inductance value to be implemented is smaller than the inductor 202 with the ferro-magnetic core.

SUMMARY OF THE INVENTION

In order the solve the problems described above, preferred embodiments of the present invention provide a semiconductor device including an inductor of a three-dimensional spiral coil, which can increase the efficiency and can increase the inductance value, without requiring a special step.

To solve the above-described problems with various conventional devices, a semiconductor device according to a preferred embodiment of the present invention includes semiconductor elements and first, second and third metal wire layers disposed at different positions in a thickness direction for electrically connecting the semiconductor elements, a core disposed on the second metal wire layer positioned in the middle in the thickness direction, a plurality of first pieces of the first metal wire layer that are overlapped with the core and arranged substantially parallel or parallel to each other and arranged at a predetermined angle relative to a direction in which the core extends, and a plurality of third pieces of the third metal wire layer that are overlapped with the core and arranged substantially parallel or parallel to each other and arranged at a predetermined angle relative to the direction in which the core extends. The plurality of first pieces and third pieces are alternately connected in series to define a spiral coil, and an inductor is defined by the coil and the core.

In this semiconductor device, a substance with high magnetic permeability can be added to the second metal wire layer. Also, it is also possible that the core has a substantially angular ring shape, a second spiral coil that is overlapped with the core is disposed separately from the spiral coil, and a transformer, of which the primary or secondary coil is the spiral coil and secondary or primary coil is the second spiral coil, is provided.

Another semiconductor device according to a preferred embodiment of the present invention includes semiconductor elements and first and second metal wire layers disposed at different positions in the thickness direction for electrically connecting the semiconductor elements, a plurality of first pieces of the first metal wire layer to be arranged parallel or substantially parallel to each other, and a plurality of second pieces of the second metal wire layer to be arranged parallel or substantially parallel to each other. A first spiral coil is formed by connecting the plurality of first pieces and second pieces alternately in series, a second spiral coil, separate from the first spiral coil, is formed by connecting the plurality of first pieces and second pieces alternately in series, a transformer, of which a primary or secondary coil is the first spiral coil, and a secondary or primary coil is the second spiral coil, is formed, and the first pieces and second pieces constituting the primary coil and the first pieces and second pieces constituting the secondary coil are positioned alternately with respect to the extending direction of the primary and secondary coils.

In the semiconductor device according to a preferred embodiment of the present invention, the core of the inductor is preferably disposed in the metal wire layer in the middle of the three metal wire layers disposed at different positions in the thickness direction of the semiconductor elements, and the three-dimensional spiral coil is arranged to surround the core, so the efficiency of the inductor can be increased and the inductance value can be increased without requiring any special steps. The transformer may be formed as the inductor, and the semiconductor device having the primary and secondary coils are arranged close to each other, can also increase the efficiency of the transformer and improve the mutual inductance value without requiring any special steps.

Other features, elements, characteristics and advantages of the present invention will become more apparent from the following detailed description of preferred embodiments of the present invention with reference to the attached drawings.

BRIEF DESCRIPTION OF THE DRAWINGS

FIGS. 3A and 3B show an example of a circuit constituting the above mentioned semiconductor device, where

DETAILED DESCRIPTION OF THE PREFERRED EMBODIMENTS

Figure 1:
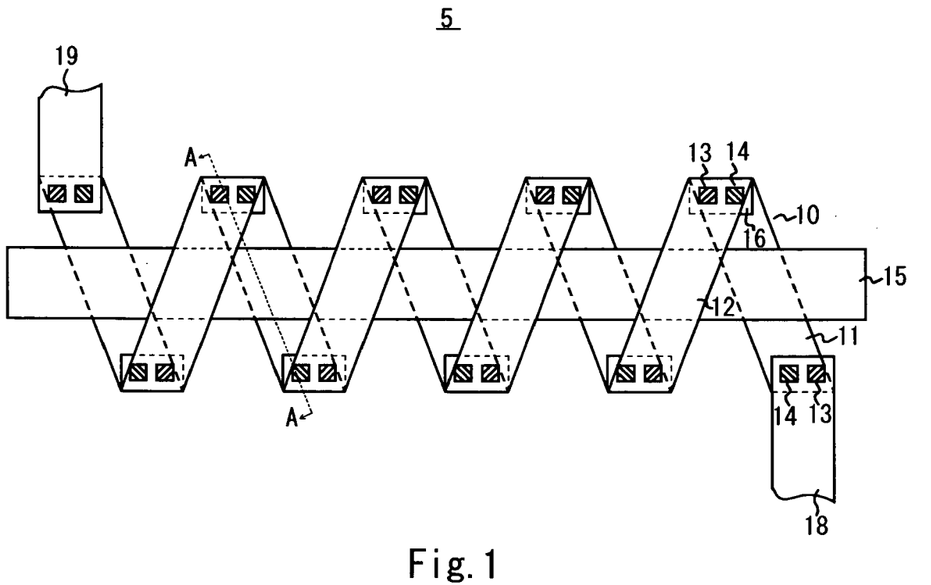
FIG. 1 is a plan view depicting the inductor to be enclosed in the semiconductor device according to a preferred embodiment of the present invention.

Preferred embodiments of the present invention will now be described with reference to the drawings. FIG. 1 is a plan view depicting an inductor 5 to be enclosed in a semiconductor device according to a preferred embodiment of the present invention. This semiconductor device preferably includes semiconductor elements, such as MOS transistors or bi-polar transistors, and first, second and third metal wire layers which are disposed at different positions in the thickness direction for electrically connecting the semiconductor elements. Inter-layer insulation films 22 and 23, to be described later, are formed between the first, second and third metal wire layers, respectively. The inductor 5 includes a core 15 which preferably has a substantially bar-shaped configuration at a portion of the second metal wire layer, which is positioned in the middle in the thickness direction, a plurality of first pieces 11 of the first metal wire layer, which is positioned at the bottom in the thickness direction, and a plurality of third pieces 12 of the third metal wire layer, which is positioned at the top in the thickness direction. More specifically, the first pieces 11 are overlapped with the core 15, and are arranged to be parallel or substantially parallel to each other with a predetermined space between each other, and arranged at a predetermined angle, such as approximately 60°, relative to the extending direction of the core 15. The third pieces 12 are overlapped with the core 15, and are arranged to be parallel or substantially parallel to each other with a predetermined space between each other, and arranged at a predetermined angle, such as approximately 60°, from the extending direction of the core so as to be axisymmetric with the first pieces 11. The pieces 11 and 12 are arranged such that ends of the pieces 11 and 12 are mutually overlapped in an overlapping area, and the connection holes 14 are disposed in the inter-layer insulation film 22, and the connection holes 13 are disposed in the inter-layer insulation film 23 in the overlapping area. The connection pieces 16 are disposed at a portion of the second metal wire layer so as to contact and be connected to the pieces 11 and 12 through the connection holes 14 and 13, respectively. Therefore, a three-dimensional spiral coil 10 is formed by alternately connecting the plurality of first pieces 11 and third pieces 12 in series, and this coil 10 defines the inductor 5 having a structure surrounding the core 15. The terminals 18 and 19 disposed at a portion of the third metal wire layer are connected respectively to the first pieces 11 to be the terminals of the coil 10. The coil 10 and the terminals 18 and 19 are also connected by the connection pieces 16 and the connection holes 14 and 13.

Figure 2:
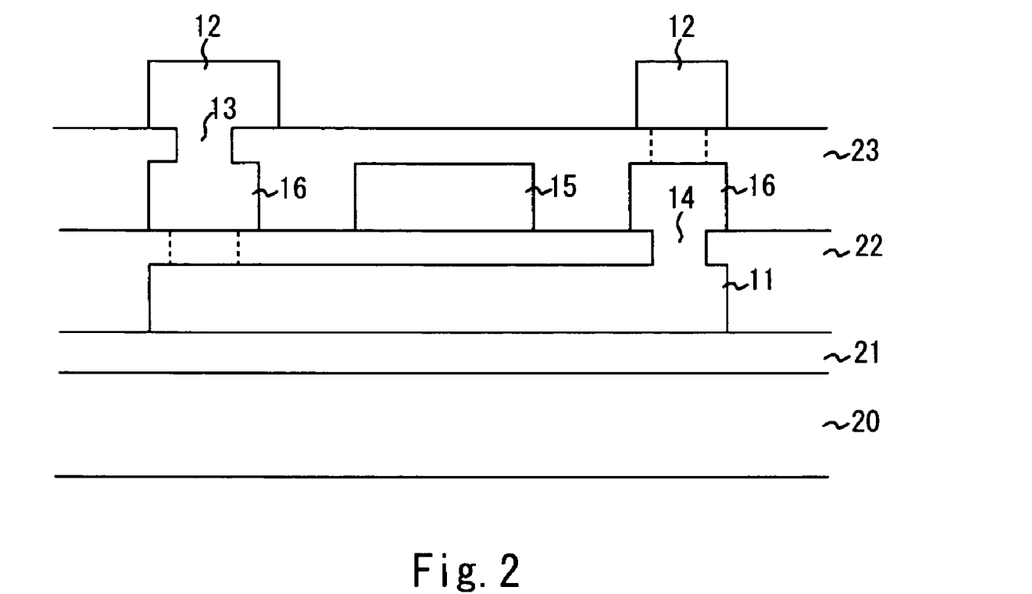
FIG. 2 is a cross-sectional view of the above mentioned inductor (cross-sectional view along the cutting-plane line A—A in FIG. 1).

FIG. 2 is a cross-sectional view of this inductor 5 along the cutting-plane line A—A. The semiconductor device preferably includes the semiconductor substrate 20, the under-layer insulation film 21, the first metal wire layer including the first pieces 11, the inter-layer insulation film 22 where the connection holes 14 are disposed, the second metal wire layer including the core 15 and the connection pieces 16, the inter-layer insulation film 23 where the connection holes 13 are disposed, and the third metal wire layer including the third pieces 12 and the terminals 18 and 19 (not illustrated), viewed from the bottom of FIG. 2. For the inter-layer insulation films 22 and 23, a silicon oxide film is preferably used. The connection pieces 16 contact and are connected to the first pieces 11 and third pieces 12, respectively, via the connection holes 14 and 13.

In this way, the core 15 is provided on the second metal wire layer, surrounded by the coil 10. This core 15 is not a distinct ferro-magnetic core, which is formed by a special step of being formed between the pieces of the top metal wire layer and bottom metal wire layer, so that the inductance value of the inductor 5 is not very large. Specifically, the metal wire layers are preferably formed by aluminum or copper as a primary material, of which the relative magnetic permeability is 1, which almost the same as a vacuum and which is much smaller than the ferro-magnetic substance. These metal wire layers, however, have a relative magnetic permeability that is higher than that of silicon oxide film, which is about 0.55, and the relative magnetic permeability of these metal wire layers can be increased by adding an appropriate amount of a substance with a high magnetic permeability, such as iron or cobalt. Therefore in the inductor 5, increasing the efficiency and increasing the inductance value are attempted while focusing on not requiring any special steps.

Figure 3A:
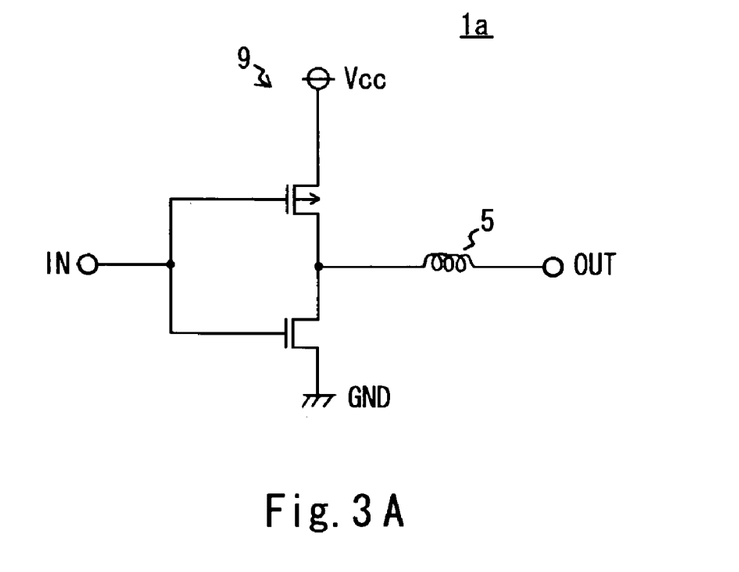
FIG. 3A is a circuit diagram and FIG. 3B is a plan view.
Figure 3B:
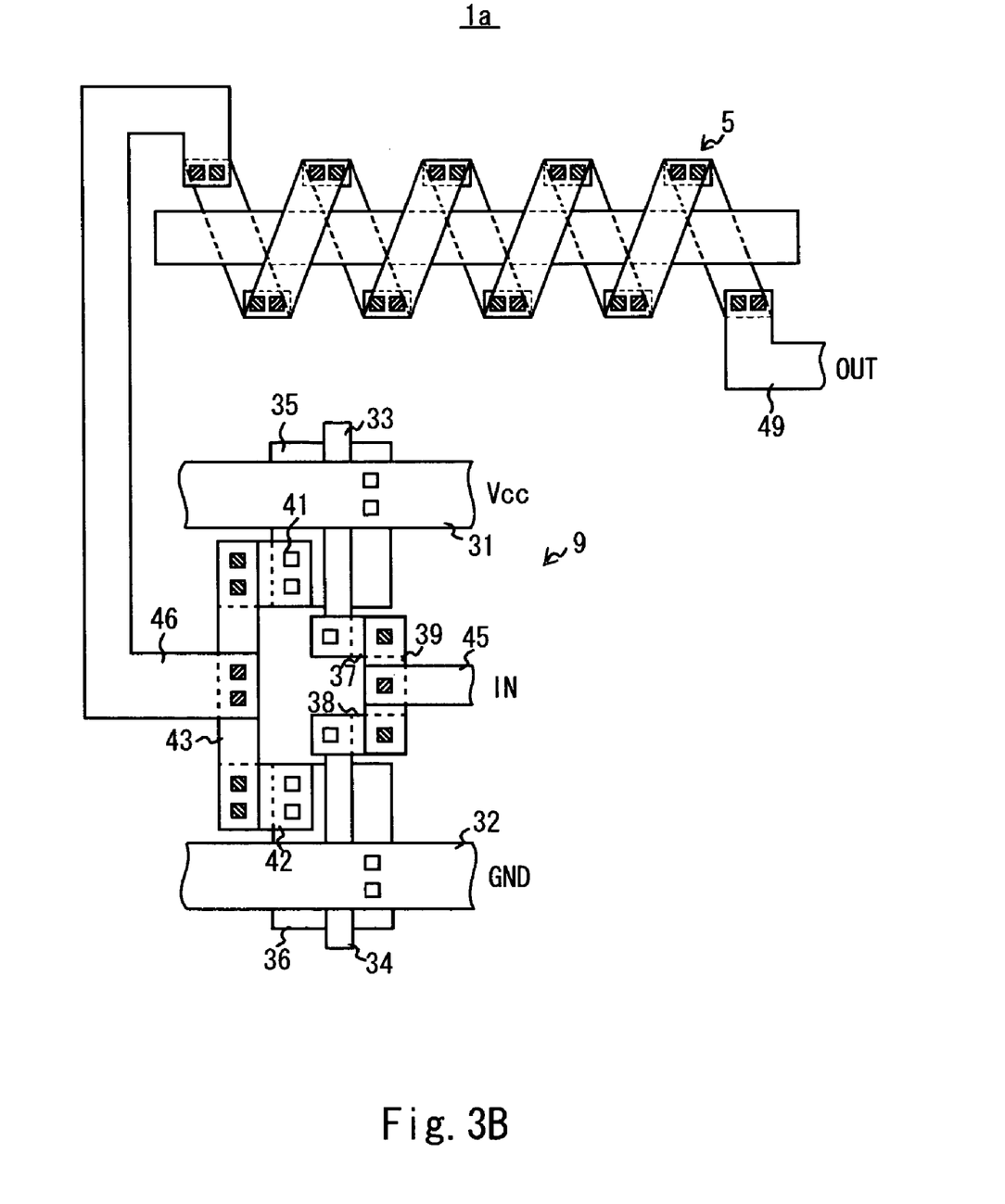

FIG. 3A is an example of the circuit 1a constituting the semiconductor device, and FIG. 3B is a plan view thereof. This circuit 1a includes a semiconductor element 9 and the above mentioned inductor 5, which are formed on the same semiconductor substrate. This semiconductor device 9 constitutes a CMOS inverter circuit where a p-type MOS transistor is formed by the p-type diffusion layer 35 and the silicide layer 33, and a n-type MOS transistor is formed by the n-type diffusion layer 36 and the silicide layer 34, respectively. The lead metal wire 45 of the input IN and the metal wire 46, which connects the output of the semiconductor device (CMOS inverter circuit) 9 and one end of the inductor 5, are formed on the third metal wire layer. The metal wire 39, which extends from the metal wire 45 to the later mentioned metal wires 37 and 38, and the metal wire 43, which extends from the later mentioned metal wires 41 and 42 to the metal wire 46, are formed on the second metal wire layer. The metal wires 37 and 38, which extend from the metal wire 39 to the silicide layers 33 and 34, the metal wires 41 and 42, which extend from the diffusion layers 35 and 36 to the metal wire 43, the power supply wire 31 and the GND wire 32 are formed on the first metal wire layer. The first, second and third metal wire layers are interconnected via the connection holes. And the other end of the inductor 5 is connected to the lead metal wire 49 of the third metal wire layer as an output OUT. The structure of the inductor 5 is as described above. The semiconductor device, therefore, can enclose the inductor 5 using the same metal wire layers as the semiconductor device 9, that is, without requiring any special manufacturing steps.

Needless to say, if there are three or more metal wire layers, any three layers thereof can be the first, second and third metal wire layers. It is also a matter of course that the number of first pieces 11 and third pieces 12 and the predetermined angle thereof relative to the extending direction of the core 15, can be appropriately set.

Figure 4:
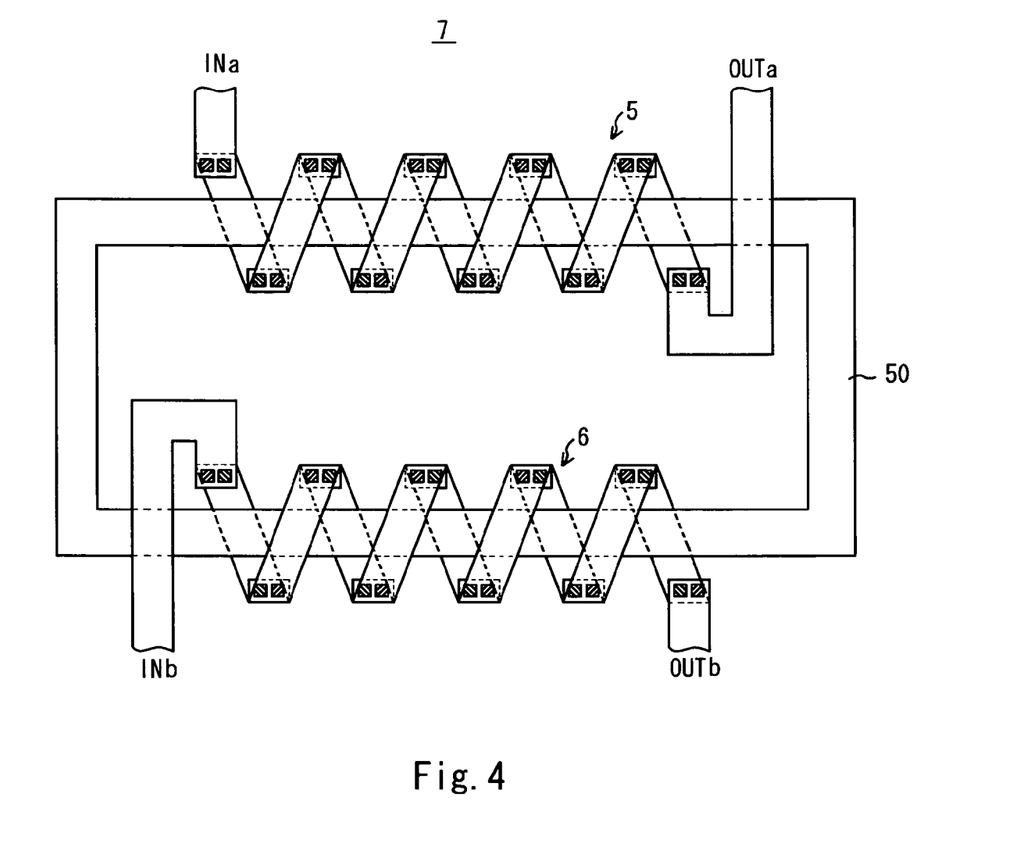
FIG. 4 is a plan view depicting a transformer including the above mentioned inductor.

Now an example of a configuration of the transformer using this three-dimensional inductor (three-dimensional spiral coil) will be described. FIG. 4 is a plan view depicting the transformer 7 to be enclosed in the semiconductor device according to a preferred embodiment of the present invention. In the transformer 7, the core 50 preferably has an angular ring shape (toroidal) on the second metal wire layer, and the coil 5 of the above-described preferred embodiment is wound around one side of the core 50, and a separate second coil 6, having substantially the same configuration as the coil 5, is wound around the opposite side of the core 50 respectively, so as to form the coil 5 as the primary (or secondary) coil and the second coil 6 as the secondary (or primary) coil. Therefore the magnetic flux (magnetic field), generated by the primary coil 5, is transferred to the secondary coil 6 through the core 50. This transformer 7, of which the core is toroidal without disconnection, has very little magnetic field leakage, and the primary coil and secondary coil thereof are closely coupled. In FIG. 4, INa and OUTa are the input terminal and output terminal of the primary coil 5, and INb and OUTb are the input terminal and output terminal of the secondary coil 6.

Figure 5:
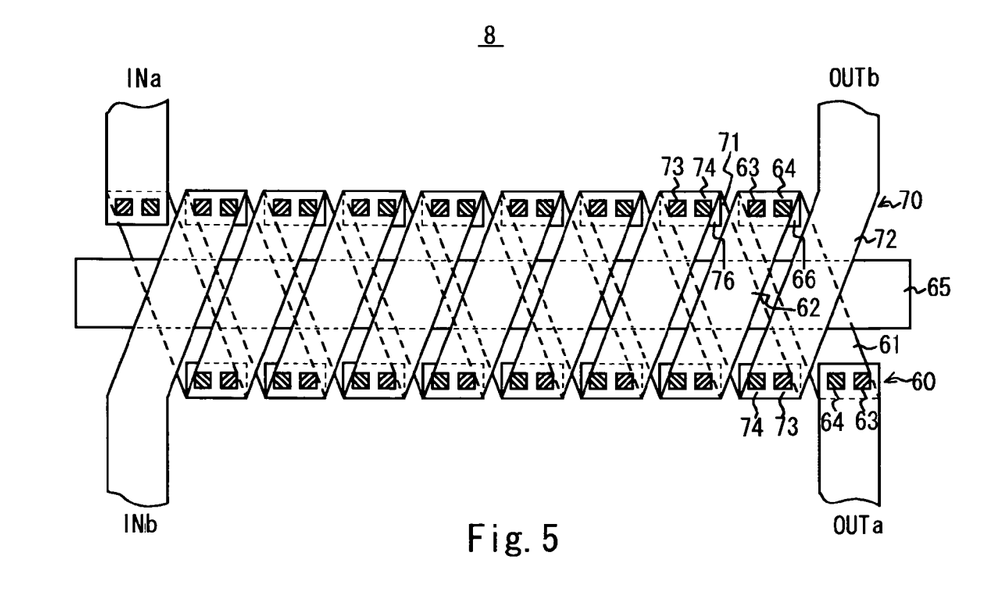
FIG. 5 is a plan view depicting another transformer including the above mentioned inductor.

Description will be now be provided for a semiconductor device where the coupling of the primary and secondary coils is closer, to increase the efficiency of the transformer and to improve the mutual inductance value. FIG. 5 is a plan view depicting the transformer 8 to be enclosed in the semiconductor device according to a preferred embodiment of the present invention. This semiconductor device includes first, second and third metal wire layers disposed at different positions in the thickness direction for electrically connecting the semiconductor elements. The inter-layer insulation films 22 and 23 are provided between the metal wire layers respectively. In the transformer 8, the primary coil 60 is formed by the core 65, which preferably has a substantially bar-shaped configuration on the second metal wire layer positioned in the middle in the thickness direction, a plurality of first pieces 61 of the first metal wire layer positioned at the bottom in the thickness direction, and a plurality of third pieces 62 of the third metal wire layer positioned at the top in the thickness direction. Just like this primary coil 60, the secondary coil 70 includes a plurality of first pieces 71 and a plurality of third pieces 72. More specifically, the first pieces 61 constituting the primary coil 60 are overlapped with the core 65 and arranged parallel or substantially parallel to each other with a space between the pieces 61, and arranged at a predetermined angle, such as approximately 60°, relative to the extending direction of the core 65. In the same way, the third pieces 62 are overlapped with the core 65 and arranged parallel or substantially parallel to each other, and arranged at a predetermined angle, such as approximately 60°, relative to the extending direction of the core 65 so as to be axisymmetrical with the first pieces 61. The pieces 61 and 62 are arranged such that ends of the pieces 61 and 62 are mutually overlapped in an overlapping area, and the connection holes 64 are disposed in the inter-layer insulation film 22, and the connection holes 63 are disposed in the inter-layer insulation film 23 in the overlapping area. And the connection pieces 66 are disposed at a portion of the second metal wire layer so as to contact and be connected to both pieces 61 and 62 through the connection holes 64 and 63. Therefore, a three-dimensional spiral coil 60 is formed by alternately connecting the plurality of first pieces 61 and third pieces 62 in series, and this coil 60 is formed as the primary coil 60 having a structure surrounding the core 65. In substantially the same way as the primary coil 60, the first pieces 71 and third pieces 72, the connection holes 74 and 73, and connection pieces 76 for constituting the secondary coil 70 are provided, and a three-dimensional spiral coil 70 is formed by connecting the plurality of first pieces 71 and third pieces 72 alternately in series, and this coil 70 is formed as the second coil 70 having a structure surrounding the core 65. An important feature is that the first pieces 61 and third pieces 62 constituting the primary coil 60 and the first pieces 71 and third pieces 72 constituting the second coil 70 are alternately positioned with respect to the extending direction of the core 65. In other words, in the extending direction of the core 65, the secondary coil 70 is contained almost within the length of the primary coil 60. In FIG. 5, INa and OUTa are the input terminal and output terminal of the primary coil 60, and INb and OUTb are the input terminal and output terminal of the secondary coil 70.

In this transformer 8, the primary coil and secondary coil are alternately wound and are extremely close to each other, so a decrease in the mutual inductance value caused by a magnetic field leakage can be further prevented. The core 65 preferably has a bar-shaped configuration in FIG. 5, but preferably could be toroidal, as mentioned above. Two or more secondary coils may be used. Needless to say, the number of turns of the primary coil and secondary coil, that is, the number of each of the pieces and a predetermined angle of each piece from the extending direction of the core 15, can be appropriately set.

When the semiconductor device has only two layers of (first and second) metal wire layers, for example, a transformer without a core can be formed by alternately connecting a plurality of first pieces disposed at a portion of the first metal wire layer and a plurality of second pieces disposed at a portion of the second metal wire layer in series to be the primary and secondary coils, just like the coils of the transformer 8. In this case as well, the primary coil and secondary coil are alternately wound and are extremely close to each other, so a decrease in the mutual inductance value caused by a magnetic field leakage can be prevented, and the efficiency of the transformer can be improved.

The present invention is not limited to the above-described preferred embodiments, but the design thereof can be changed in various ways within the scope of the issues stated in the claims.

What is claimed is:

1. A semiconductor device comprising:

semiconductor elements;

first, second and third metal wire layers disposed at different positions in a thickness direction for electrically connecting said semiconductor elements;

a core disposed on the second metal wire layer positioned in a middle in the thickness direction;

a plurality of first pieces of the first metal wire layer overlapped with the core and arranged substantially parallel to each other and arranged at a predetermined angle relative to a direction in which the core extends; and a plurality of third pieces of the third metal wire layer overlapped with the core and arranged substantially parallel to each other and arranged at a predetermined angle relative to the direction in which the core extends; wherein the plurality of first pieces and third pieces are alternately connected in series to define a first spiral coil, and an inductor is defined by the coil and the core.

2. The semiconductor device according to claim 1, wherein a substance with high magnetic permeability is included in said second metal wire layer.

3. The semiconductor device according to claim 1, wherein the core has a substantially angular ring shape, a second spiral coil that is overlapped with the core is disposed separately from said first spiral coil, and a transformer of which one of a primary coil and a secondary coil is the first spiral coil, and the other of the primary coil and the secondary coil is the second spiral coil, is provided.

4. The semiconductor device according to claim 1, wherein a second spiral coil that is overlapped with the core is disposed separately from said first spiral coil, a transformer of which one of a primary coil and a secondary coil is the first spiral coil, and the other of the primary coil and the secondary coil is the second spiral coil, is provided, and the first pieces and third pieces constituting the primary coil and the first pieces and third pieces constituting the secondary coil are alternately positioned with respect to the direction in which the core extends.

5. The semiconductor device according to claim 4, wherein the core has a substantially angular ring shape.

6. The semiconductor device according to claim 2, wherein the core has a substantially angular ring shape, a second spiral coil that is overlapped with the core is disposed separately from said first spiral coil, and a transformer of which one of a primary coil and a secondary coil is the first spiral coil, and the other of the primary coil and the secondary coil is the second spiral coil, is provided.

7. The semiconductor device according to claim 2, wherein a second spiral coil that is overlapped with the core is disposed separately from said first spiral coil, a transformer of which one of a primary coil and a secondary coil is the first spiral coil, and the other of the primary coil and the secondary coil is the second spiral coil, is provided, and the first pieces and third pieces constituting the primary coil and the first pieces and third pieces constituting the secondary coil are alternately positioned with respect to the direction in which the core extends.

8. The semiconductor device according to claim 7, wherein the core has a substantially angular ring shape.

9. The semiconductor device according to claim 1, further comprising inter-layer insulation films disposed between the first, second and third metal wire layers, respectively.

10. The semiconductor device according to claim 1, wherein the core has a substantially bar-shaped configuration.

11. The semiconductor device according to claim 1, wherein the predetermined angle is approximately 60°.

12. A semiconductor device comprising:

semiconductor elements;

first and second metal wire layers disposed at different positions in a thickness direction for electrically connecting said semiconductor elements;

a plurality of first pieces of the first metal wire layer arranged to be substantially parallel to each other; and a plurality of second pieces of the second metal wire layer arranged to be substantially parallel to each other; wherein a first spiral coil is defined by alternate ones of the plurality of first pieces and second pieces being connected in series, and a second spiral coil, separate from the first spiral coil, is defined by alternate ones of the plurality of first pieces and second pieces being connected in series;

a transformer of which one of a primary coil and a secondary coil is the first spiral coil and the other of the primary coil and the secondary coil is the second spiral coil, is provided, and the first pieces and second pieces constituting the primary coil and the first pieces and second pieces constituting the secondary coil are alternately positioned with respect to an extending direction of the primary and secondary coils.

* * * * *